United States Patent
Wang et al.

(10) Patent No.: US 9,412,836 B2
(45) Date of Patent: Aug. 9, 2016

(54) CONTACTS FOR TRANSISTORS

(71) Applicant: Taiwan Semiconductor Manufacturing Co., Ltd., Hsin-Chu (TW)

(72) Inventors: Li-Ting Wang, Hsinchu (TW);
Teng-Chun Tsai, Hsinchu (TW);
Cheng-Tung Lin, Jhudong Township (TW); Hung-Ta Lin, Hsinchu (TW);
Huicheng Chang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/198,841

(22) Filed: Mar. 6, 2014

(65) Prior Publication Data

US 2015/0255575 A1 Sep. 10, 2015

(51) Int. Cl.
*H01L 29/66* (2006.01)
*H01L 29/20* (2006.01)
*H01L 29/36* (2006.01)
*H01L 29/78* (2006.01)
*H01L 21/28* (2006.01)

(52) U.S. Cl.
CPC .... *H01L 29/66522* (2013.01); *H01L 21/28264* (2013.01); *H01L 29/20* (2013.01); *H01L 29/365* (2013.01); *H01L 29/78* (2013.01)

(58) Field of Classification Search
CPC ............ H01L 29/365; H01L 21/02584; H01L 29/4236; H01L 29/0847; H01L 29/7784; H01L 29/66462
USPC ................................................. 257/192–196
See application file for complete search history.

(56) References Cited

U.S. PATENT DOCUMENTS

| 4,772,934 | A   |   | 9/1988  | Cunningham et al.         |
|-----------|-----|---|---------|---------------------------|
| 4,780,748 | A   | * | 10/1988 | Cunningham et al. 257/24  |
| 5,635,735 | A   | * | 6/1997  | Miyamoto et al. 257/192   |
| 6,521,961 | B1  | * | 2/2003  | Costa ........ H01L 21/28587 257/183 |
| 8,110,877 | B2  |   | 2/2012  | Mukherjee et al.          |
| 8,324,058 | B2  |   | 12/2012 | Cheng et al.              |
| 2009/0283756 | A1 | * | 11/2009 | Hellings et al. 257/24 |
| 2010/0155846 | A1 | * | 6/2010  | Mukherjee et al. 257/365 |

(Continued)

FOREIGN PATENT DOCUMENTS

JP WO 2012157625 A1 * 11/2012 .......... H01L 29/2003

OTHER PUBLICATIONS

"Epitaxial InGaAs Source/Drain Regions for Highly Scaled nMOS Devices." Intel Ireland Research Conference, Nov. 21-22, 2013.

(Continued)

*Primary Examiner* — John C Ingham
*Assistant Examiner* — Frederick B Hargrove
(74) *Attorney, Agent, or Firm* — Eschweiler & Associates, LLC (57) ABSTRACT

The present disclosure relates to a semiconductor device having a delta doped sheet layer within a transistor's source/drain region to reduce contact resistance, and an associated method. In some embodiments, a dielectric layer is disposed over the transistor. A trench is disposed through the dielectric layer to the source/drain region and a conductive contact is disposed in the trench. The source/drain region comprises a delta doped sheet layer with a doping concentration that is higher than rest of the source/drain region.

19 Claims, 7 Drawing Sheets

(56) References Cited

U.S. PATENT DOCUMENTS

| | | | |
|---|---|---|---|
| 2011/0233613 A1* | 9/2011 | Jeon et al. | 257/194 |
| 2013/0087833 A1* | 4/2013 | Wang | H01L 29/66477 257/192 |
| 2015/0028388 A1* | 1/2015 | Majumdar et al. | 257/192 |
| 2015/0069467 A1* | 3/2015 | Lin | H01L 29/7781 257/192 |

OTHER PUBLICATIONS

Agrawal, et al. "A Unified Model for Insulator Selection to Form Ultra-Low Resistivity Metalinsulator-Semiconductor Contacts to n-Si, n-Ge, and n-InGaAs." American Institute of Physics, published in 2012. 5 Pages.

Gupta, et al. "Contact Resistivity Reduction Through Interfacial Layer Doping in Metalinterfacial Layer-Semiconductor Contacts." Journal of Applied Physics, published in 2013. 8 Pages.

\* cited by examiner

CONTACTS FOR TRANSISTORS

BACKGROUND

In the semiconductor integrated circuits (ICs) industry, devices are formed on a wafer and electrically connected to interconnection layers by conductive contacts.

With the continued scaling down of semiconductor devices, interface resistance between conductive contacts and active regions of semiconductor devices, a significant part of contact resistance, becomes a critical factor to achieve good performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For III-V field effect transistors, an in-situ n-type heavy doping (doping concentration higher than $10^{20}/cm^3$) is difficult to achieve by current industry deposition techniques, for example, metal-organic chemical vapor deposition (MOCVD). Low doping concentration within a source/drain region of a transistor increases an interface resistance between the source/drain region and its corresponding metal contact above the source/drain region. To reduce the interface resistance, the present disclosure sets forth techniques that use a plurality of delta doped sheet layers with very high doping concentrations which are formed during the formation of the source/drain region. An insulating layer is inserted between the source/drain region and its corresponding metal contacts to reduce metal-induced gap state density and Fermi unpinning to help further decrease contact resistance.

Figure 1:
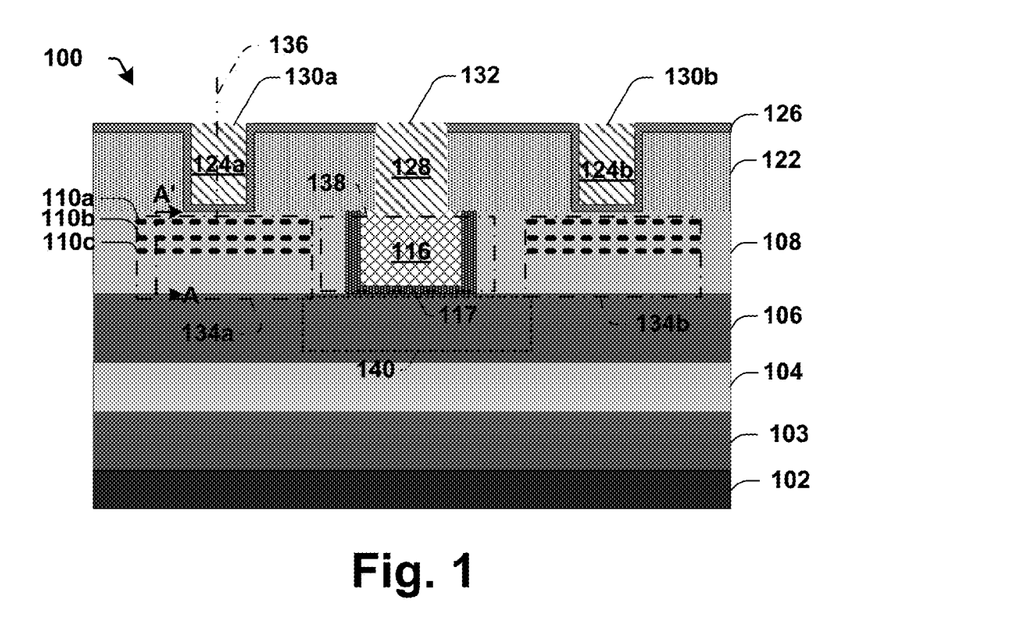
FIG. 1 illustrates a cross-sectional view of some embodiments of a semiconductor device.

FIG. 1A illustrates a cross-sectional view of some embodiments of a semiconductor transistor device 100. The semiconductor transistor device 100 could for example, comprise a III-V field effect transistor. The transistor 100 comprises a gate structure 138, which includes a conductive gate electrode 116 and a gate dielectric 117, disposed over a channel region 140 over a semiconductor substrate 102. Source/drain regions 134a, 134b are arranged alongside the gate structure 138 and are separated by one another by the channel region 140. The channel region 140 and source/drain regions 134a, 134b have opposite doping types, and a doping concentration of the source/drain regions 134a, 134b is higher than that of the channel region 140. In some embodiments, the channel region 140 comprises a first semiconductor layer 106 comprising an InGaAs compound with a silicon doping concentration of approximately $2\times10^{18}/cm^3$; while the source/drain regions 134a, 134b comprise a second semiconductor layer 108 comprising a InGaAs compound with a silicon doping concentration ranging from approximately $2\times10^{18}/cm^3$ to approximately $1\times10^{20}/cm^3$. A barrier layer 104 (such as an InAlAs layer, for example), a buffer layer 103 (such as an InP layer), and a substrate layer 102 underlie the first semiconductor layer 106.

A plurality of delta doped sheet layers, for example, 110a, 110b and 110c are arranged within the source/drain regions 134a, 134b. In some embodiments, a sheet doping concentration of a delta doped sheet layer is larger than approximately $1\times10^{13}/cm^2$, which can correspond to a doping concentration ranging from approximately $5\times10^{18}/cm^3$ to approximately $5\times10^{21}/cm^3$. In the illustrated embodiment, a first delta doped sheet layer 110a is arranged in the source/drain region 134a under a conductive contact 130a. The first delta doped sheet layer 110a is arranged in a first plane that is perpendicular to an axis 136 of the conductive contact 130a. The first plane is very close to top surface of the source/drain region 134a, for example, from about 1 Å to about 15 Å away from the top surface of the source/drain region 134a. A second delta doped sheet layer 110b is arranged under the first delta doped sheet layer 110a. The second delta doped sheet layer 110b is arranged in a second plane that is in parallel with the first plane, for example, the distance between the first plane and the second plane, 208, about 5 Å to about 20 Å. A doping concentration of the plurality of delta doped sheet layers is higher than the rest of the source/drain region. Thicknesses of the plurality of the delta doped layers are approximately same in some embodiments.

Figure 2:
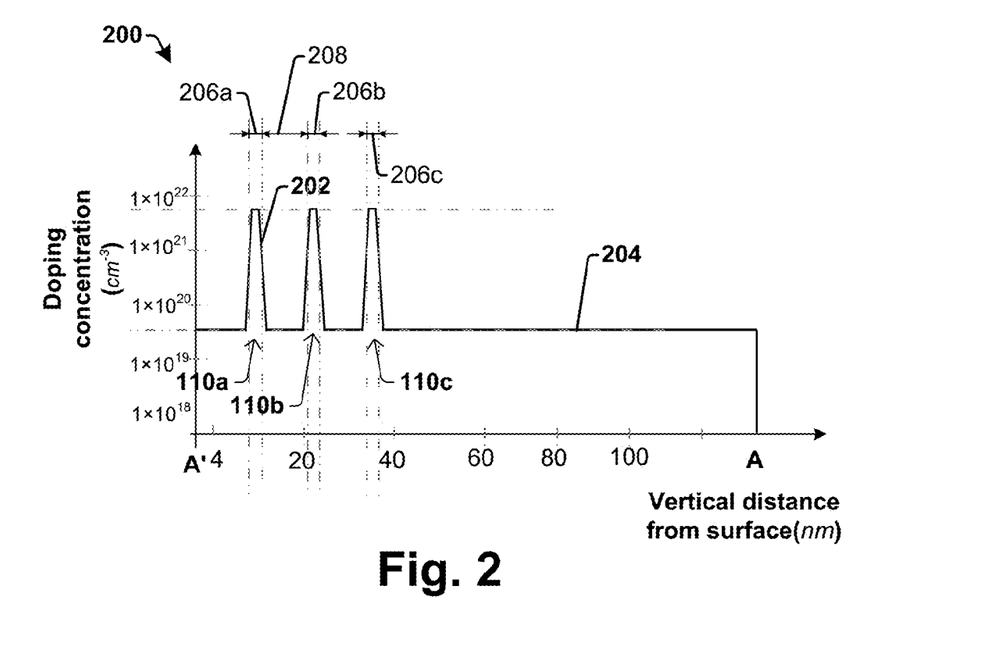
FIG. 2 illustrates a graph of some embodiments showing a doping concentration profile along a vertical cross-section extending through a semiconductor layer.

As shown in FIG. 2, which shows a doping concentration profile along a vertical cross-section A'-A extending through a semiconductor layer 108. The delta doped layers 110a, 110b and 110c can have thicknesses 206a, 206b and 206c, respectively. Each of these thicknesses can be defined by a full width at half maximum (FWHM) value. In some embodiments, the thicknesses 206a, 206b, and/or 206c can each range from approximately 1 Å to approximately 20 Å. Neighboring delta doped layers can be separated by distance 208, as measured between FWHM values, which can range from about 5 Å to about 20 Å. The doping concentration profile of graph 200 comprises a first doping concentration level 204 for a source/drain region 134 at approximately $3\times10^{19}/cm^3$~$5\times10^{19}/cm^3$. The maximum value of the delta doping concentration is approximately $1\times10^{20}/cm^3$~$5\times10^{21}/cm^3$. A width of the FWHM dimension can be about 4 Å.

Referring back to FIG. 1, a dielectric layer 122 is disposed over the gate structure 138 and the source/drain regions 134a, 134b. Trenches 124a, 124b are formed through the dielectric layer 122 extending downwardly to the source/drain regions 134a, 134b. Conductive contacts 130a, 130b are disposed in the trench 124 over the source/drain regions 134a, 134b. The conductive contact can comprise a metal, for example, Zn, Al, Ti, Mo, W, Ni, or Pt. In some embodiments, an insulating layer 126 is disposed between the source/drain region 134a and the conductive contact 130a. In some embodiments, a thickness of the insulating layer 126 can be from approximately 1 Å to approximately 100 Å. The insulating layer can be La2O2, ZnS, ZnSe, ZnO, TiO2, GeO2, or Ta2O5. This insulating layer 126 is formed continuously over the upper surface of the source/drain regions 134a, 134b, and is believed to lower the Schottky barrier height between metal contacts 130a, 130b and S/D regions 134a, 134b to promote efficient carrier transport, for example, by promoting efficient carrier tunneling through the insulating layer 126.

The channel region 140 could comprise parts of one or more semiconductor layers comprising bandgap materials, for example, a part of a first semiconductor layer 106 under the gate structure 138. In some embodiments, the channel region comprises an InGaAs compound with a silicon doping concentration of approximately $2\times10^{18}/cm^3$.

Figure 3:
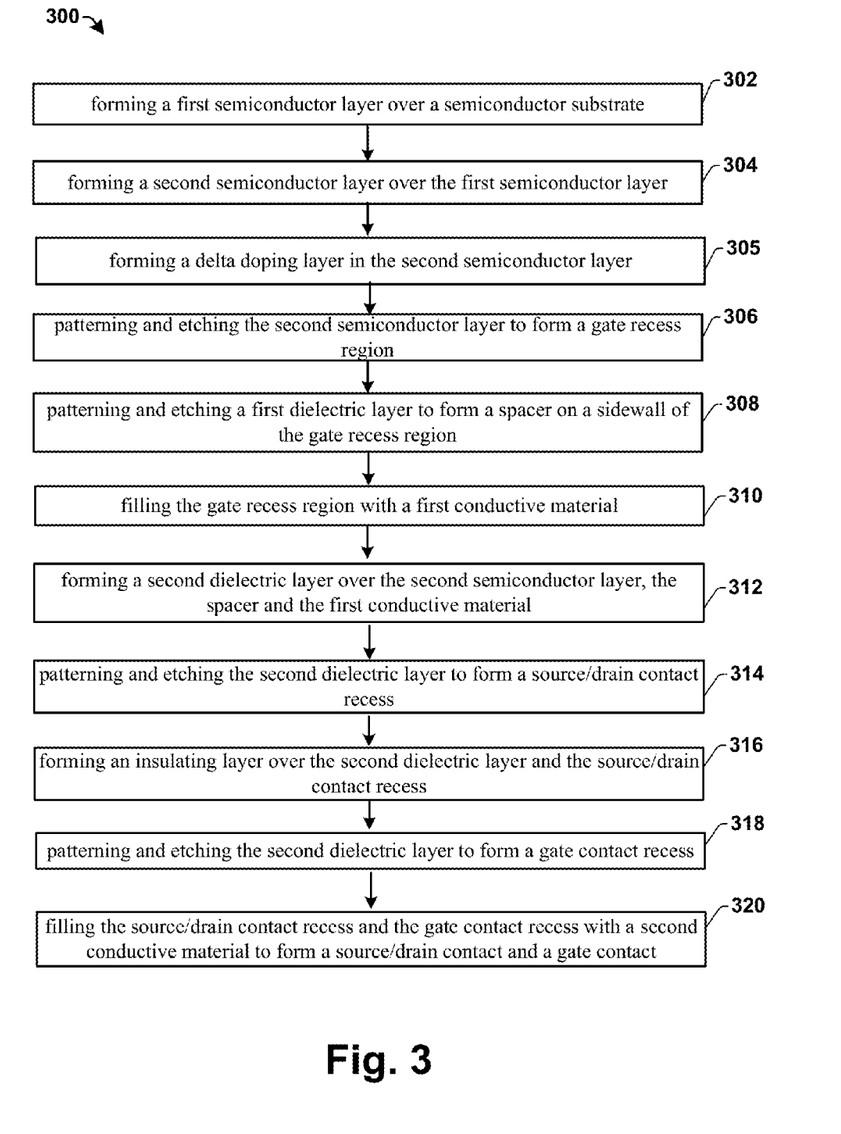
FIG. 3 illustrates a flow diagram of some embodiments of a method of forming contacts for a transistor.

FIG. 3 illustrates a flow diagram of some embodiments of a method of forming contacts for a transistor.

While disclosed methods (e.g., methods 300) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a first semiconductor layer as a channel layer is formed over a semiconductor substrate.

In some embodiments, a plurality of distinct epitaxial layers are deposited over the semiconductor substrate before the formation of the channel layer, such as a buffer layer or a barrier layer. For example, InAlAs can be formed as a barrier layer for a III-V device. In some embodiments, the plurality of distinct epitaxial layers may be deposited in-situ within a same processing chamber (i.e., without removing the semiconductor substrate from the processing chamber).

At 304 and 305, a second semiconductor layer as a source/drain region layer is formed over the first semiconductor layer wherein at least one delta doping profile is formed. In some embodiments, the second semiconductor layer can be deposited by MOCVD at a temperature ranging from approximately 400° C. to approximately 700° C. and at a pressure ranging from approximately 50 mbar to 100 mbar.

Trimethylindium(TMIn), trimethylgallium(TMGa), and tributylarsine(TBAs) can be applied as metalorganic precursors.

The delta doping profiled is formed by applying a SiH4 or Si2H6 gas with a flow rate lower than approximately 1000 sccm.

At 306, the second semiconductor layer is patterned and etched to form a gate recess region. In some embodiments, a photolithography and a plurality of etching processes may be used to form the gate recess.

At 308, a first dielectric layer is patterned and etched to form a spacer on a sidewall of the gate recess region. In some embodiments, the first dielectric layer can be SiO2, SiN, or SiOCN among other dielectric materials.

At 310, the gate recess region is filled with a gate dielectric layer and a first conductive material. The gate dielectric layer could comprise oxide or high k dielectric material. In some embodiments, an additional cap layer can be deposited into the gate recess. A high temperature anneal may be performed for a time of between approximately 30 s and approximately 240 s within a processing chamber held at a temperature in a range of between approximately 700° C. and approximately 900° C. and at a pressure having a range of between approximately 10 torr and approximately 200 torr.

At 312, a second dielectric layer as an interlayer dielectric is formed over the second semiconductor layer, the spacer and the first conductive material. In some embodiments, a chemical mechanical polishing (CMP) can be applied before the formation of the interlayer dielectric.

At 314, the second dielectric layer is patterned and etched to form a source/drain contact recess.

At 316, an insulating layer is formed over the second dielectric layer and the source/drain contact recess. The insulating layer can lower a schottky barrier height (SBH) and further reduce contact resistance.

At 318, the second dielectric layer is patterned and etched to form a gate contact recess.

At 320, the source/drain contact recess and the gate contact recess are filled with a second conductive material to form a source/drain contact and a gate contact.

FIGS. 4a-4i illustrate some embodiments of cross-sectional views of a semiconductor substrate showing a method of forming contacts for a transistor.

Although FIGS. 4a-4i are described in relation to method 300, it will be appreciated that the structures disclosed in FIGS. 4a-4i are not limited to such a method.

Figure 4A:
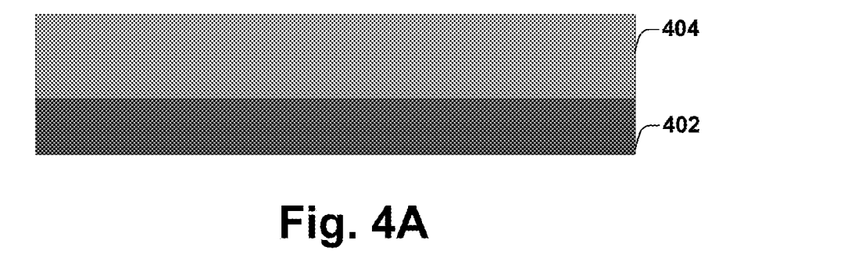
FIGS. 4a-4i illustrate some embodiments of cross-sectional views of a semiconductor substrate showing a method of forming contacts for a transistor.

As shown in FIG. 4a, a first semiconductor layer 404 is formed over a semiconductor substrate 402. In various embodiments, the semiconductor substrate 402 may comprise any type of semiconductor body (e.g., silicon, silicon-germanium, silicon-on-insulator, etc.) such as a semiconductor wafer and/or one or more die on a semiconductor wafer, as well as any other type of semiconductor and/or epitaxial layers associated therewith.

Figure 4B:
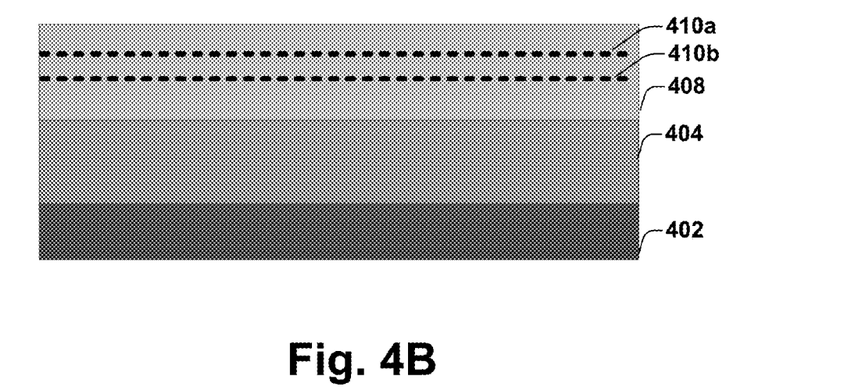

As shown in FIG. 4b, a second semiconductor layer 408 is formed over the first semiconductor layer 404 wherein at least one delta doping profile 410 is formed. A plurality of delta doping layers can be formed within the second semiconductor layer 408. A first delta doping layer 410a is close to a top surface of the second semiconductor layer 408, for example, about 1 Å to about 15 Å away from the top surface.

Figure 4C:
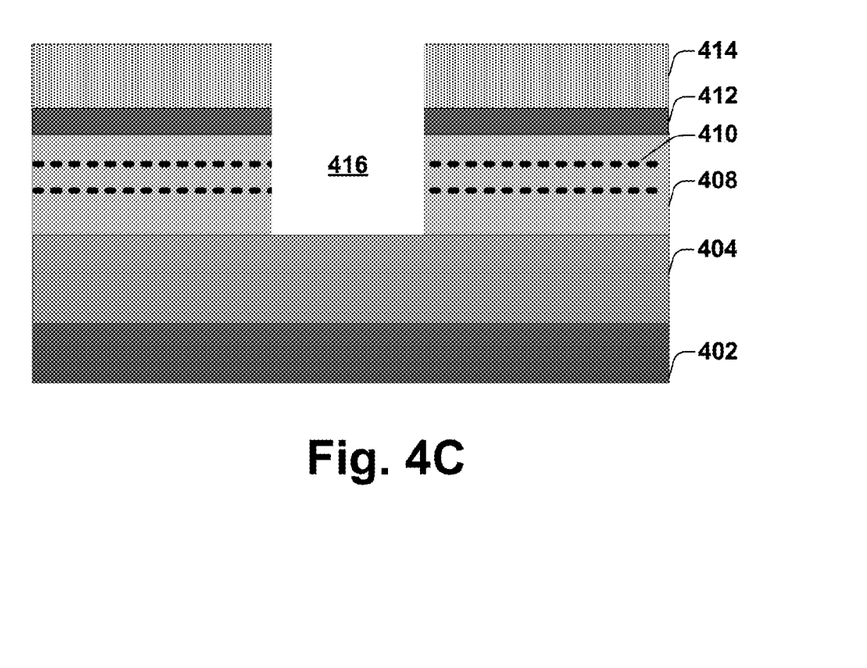

As shown in FIG. 4c, the second semiconductor layer 408 is patterned and etched to form a gate recess region 416. A hard mask (HM) layer 412 and/or a photo resistor (PR) layer 414 are formed over the second semiconductor layer 408 to help the patterning and etching process.

Figure 4D:
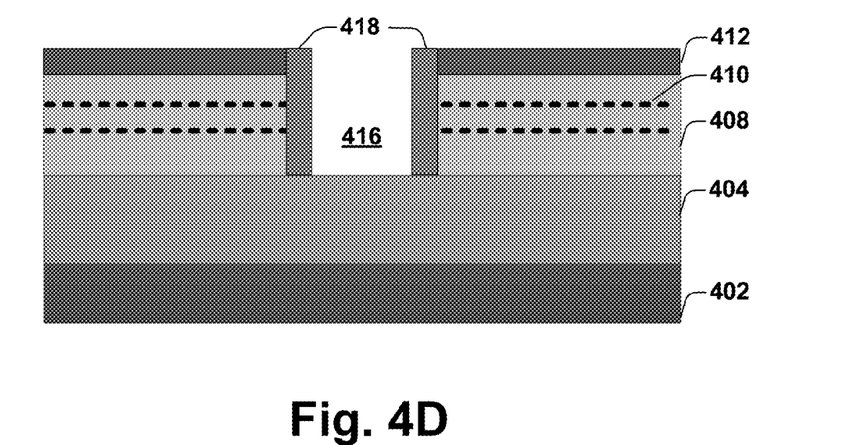

As shown in FIG. 4d, a first dielectric layer is patterned and etched to form a spacer 418 on a sidewall of the gate recess region 416. The hard mask layer 412 can be kept during the process.

Figure 4E:
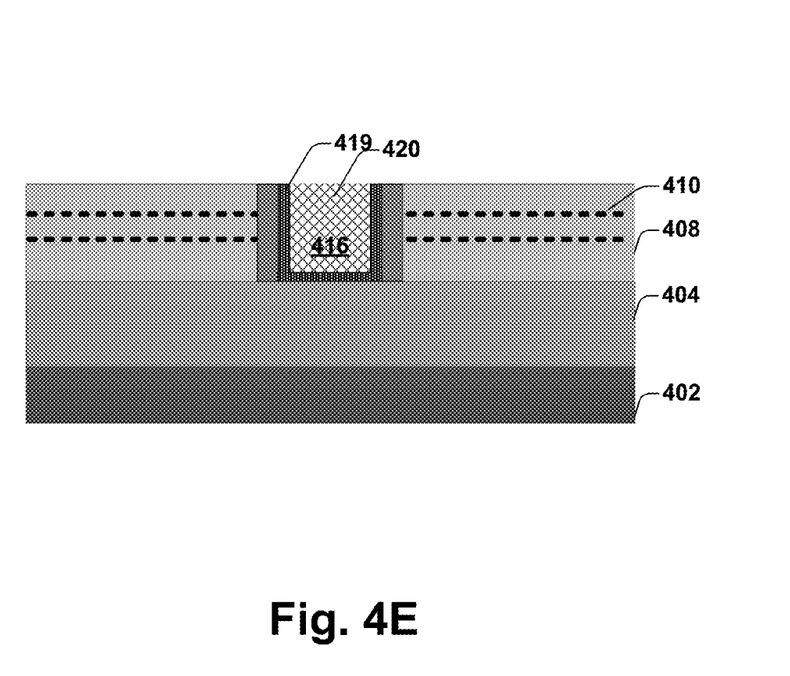

As shown in FIG. 4e, the gate recess region is filled with a gate dielectric layer 419 and a first conductive material 420. The gate dielectric layer 419, for example, a high-k material and the first conductive material 420 can be deposited over the gate recess 416 and the second semiconductor layer 408 first and then partially removed by a CMP process.

Figure 4F:
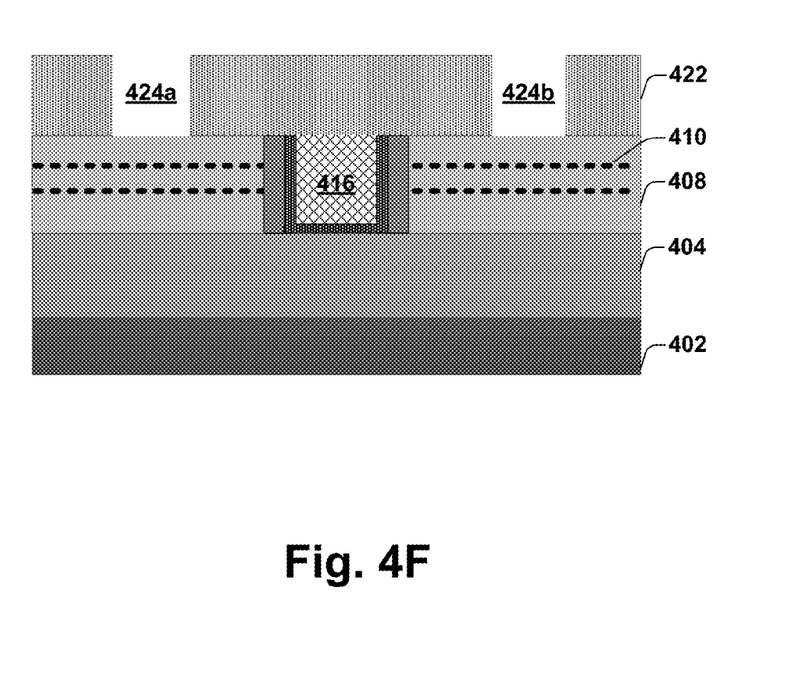

As shown in FIG. 4f, a second dielectric layer 422 is formed over the second semiconductor layer 408, the spacer 418 and the first conductive material 420. The second dielectric layer 422 is then patterned and etched to form a source/drain contact recess 424.

Figure 4G:
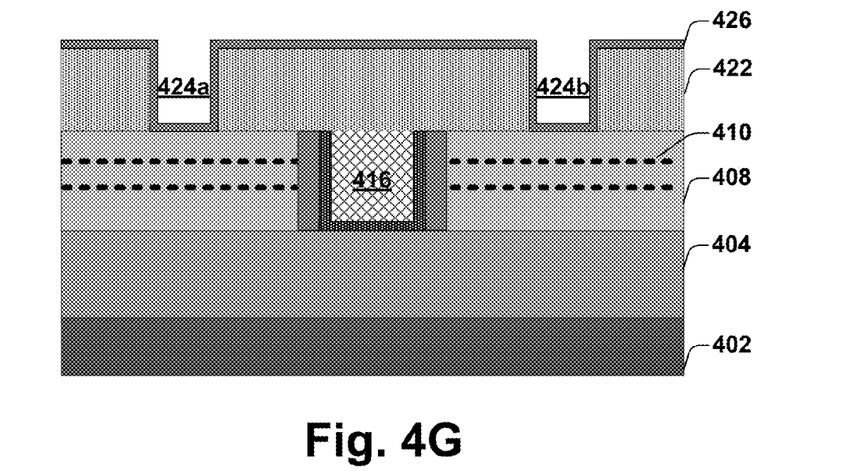

As shown in FIG. 4g, an insulating layer 426 is formed over the second dielectric layer 422 and the source/drain contact recess 424.

Figure 4H:
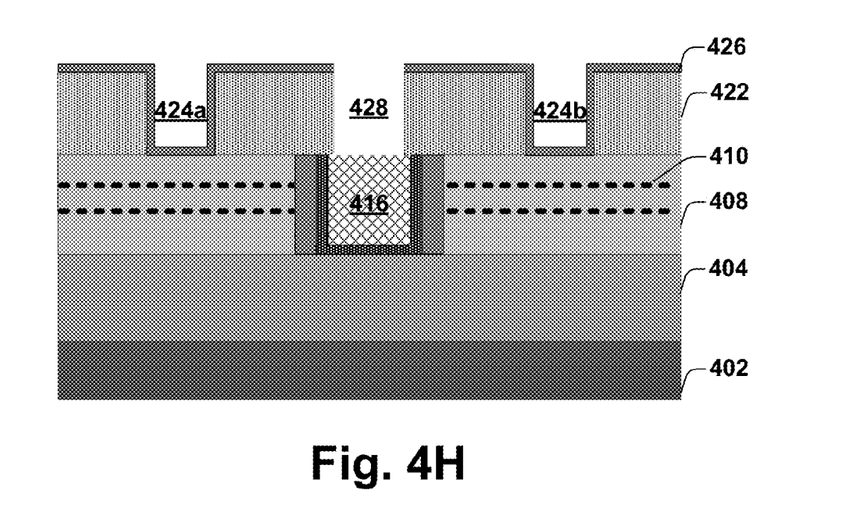

As shown in FIG. 4h, the second dielectric layer 422 is patterned and etched again to form a gate contact recess 428.

Figure 4I:
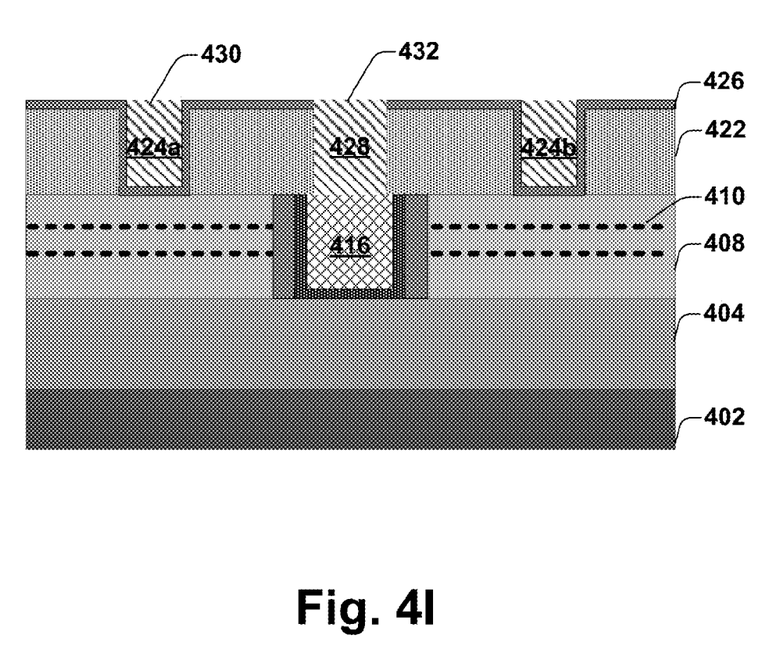

As shown in FIG. 4i, the source/drain contact recess 424 and the gate contact recess 428 are filled with a second conductive material to form a source/drain contact 430 and a gate contact 432.

In some embodiments, the present disclosure relates to a semiconductor device. The semiconductor device comprises a transistor with a source/drain region, a dielectric layer disposed over the transistor, a trench through the dielectric layer to the source/drain region and a conductive contact disposed in the trench. The source/drain region comprises a delta doped sheet layer with a doping concentration that is higher than rest of the source/drain region.

In other embodiments, the present disclosure relates to a transistor device. The transistor device comprises a gate structure disposed over a channel region over a semiconductor substrate, a source/drain region arranged alongside the gate structure having a heavy doped layer with a doping concentration higher than that of the channel region, at least one delta doped sheet layer disposed within the source/drain region and a conductive contact disposed over the source/drain region.

In yet other embodiments, the present disclosure relates to a method of forming contacts for transistors. The method comprises forming a first semiconductor layer over a semiconductor substrate, forming a second semiconductor layer over the first semiconductor layer and forming a delta doping layer in the second semiconductor layer. The method further comprises patterning and etching the second semiconductor layer to form a gate recess region, patterning and etching a first dielectric layer to form a spacer on a sidewall of the gate recess region and filling the gate recess region with a first conductive material. The method further comprises forming a second dielectric layer over the second semiconductor layer, the spacer, and the first conductive material and patterning and etching the second dielectric layer to form a source/drain contact recess. The method further comprises patterning and etching the second dielectric layer to form a gate contact recess. The method further comprises filling the source/drain contact recess and the gate contact recess with a second conductive material to form a source/drain contact and a gate contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a transistor with a first source/drain region and a second source/drain region separated by a gate structure, wherein the first and second source/drain regions have upper surfaces coplanar with an upper surface of the gate structure;
   a dielectric layer disposed over the transistor;
   a first trench disposed through the dielectric layer to the first source/drain region and a second trench disposed through the dielectric layer to the gate structure; and
   a source/drain conductive contact disposed in the first trench and a gate contact disposed in the second trench;
   wherein the first source/drain region comprises a delta doped sheet layer disposed near an upper surface of the first source/drain region with a doping concentration that is higher than rest of the first source/drain region.

2. The semiconductor device of claim 1, wherein the first source/drain region comprises:
   a first delta doped sheet layer arranged under the source/drain conductive contact and being arranged in a first plane that is perpendicular to an axis of the source/drain conductive contact; and
   a second delta doped sheet layer arranged under the first delta doped sheet layer and being arranged in a second plane that is in parallel with the first plane.

3. The semiconductor device of claim 1, wherein the source/drain conductive contact is separated from the first source/drain region by an insulating layer.

4. The semiconductor device of claim 1, wherein a sheet doping concentration of the delta doped sheet layer is larger than approximately $1\times10^{13}/cm^2$.

5. The semiconductor device of claim 1, wherein the transistor is a III-V field effect transistor.

6. The semiconductor device of claim 1, wherein the first source/drain region comprises InGaAs and the delta doped sheet layer has silicon as a dopant.

7. A transistor device, comprising:
   a gate structure disposed over a channel region over a semiconductor substrate;
   a source/drain region arranged alongside the gate structure having a heavy doped layer with a doping concentration higher than that of the channel region;
   at least one delta doped sheet layer disposed within the source/drain region;
   a source/drain conductive contact disposed over the source/drain region; and
   a spacer laterally arranged between a gate dielectric layer and the source/drain region, wherein the spacer has an upper surface aligned with an upper surface of the source/drain region.

8. The transistor device of claim 7, wherein the channel region comprises InGaAs with a Silicon doping concentration approximately $2\times10^{18}/cm^3$.

9. The transistor device of claim 8, wherein the source/drain region comprises InGaAs with a Silicon doping concentration higher than the Silicon doping concentration of the channel region and ranging from approximately $2\times10^{18}/cm^3$ to approximately $1\times10^{20}/cm^3$.

10. The transistor device of claim 9, wherein a doping concentration of the delta doped sheet layer is higher than that of the source/drain region and ranges from approximately $5\times10^{18}/cm^3$ to approximately $5\times10^{21}/cm^3$.

11. The transistor device of claim 9, wherein a thickness of the delta doped sheet layer ranges from approximately 1 Å to approximately 20 Å.

12. The transistor device of claim 7, further comprising an insulating layer physically separating the source/drain region and the source/drain conductive contact.

13. The transistor device of claim 12, wherein the insulating layer comprises $La_2O_2$, ZnS, ZnSe, ZnO, $TiO_2$, $GeO_2$, or $Ta_2O_5$.

14. The transistor device of claim 12, wherein the source/drain conductive contact comprises Zn, Al, Ti, Mo, W, Ni, or Pt.

15. The transistor device of claim 12, wherein a thickness of the insulating layer is from approximately 1 Å to approximately 100 Å.

16. A transistor device, comprising:
a first silicon-doped InGaAs layer disposed over a substrate and having a channel region disposed therein;
a second silicon-doped InGaAs layer disposed over the first silicon-doped InGaAs layer and having a first source/drain region and a second source/drain region, wherein the second silicon-doped InGaAs layer comprises a plurality of vertically separated silicon delta doped sheet layers laterally extending below first and second source/drain contacts overlying the first source/drain region and the second source/drain region; and
a gate structure that extends through the second silicon-doped InGaAs layer to reach on an upper surface of the first silicon-doped InGaAs layer at a position laterally separating the first source/drain region and the second source/drain region;
wherein the first silicon-doped InGaAs layer is in direct contact with the second silicon-doped InGaAs layer.

17. The transistor device of claim 16, further comprising:
a dielectric layer disposed over the second silicon-doped InGaAs layer and the gate structure; and
a gate contact extending through the dielectric layer to the gate structure; and
wherein the first and second source/drain contacts respectively extend through the dielectric layer to the first and second source/drain regions.

18. The transistor device of claim 17, further comprising:
an insulating layer vertically separating the first and second source/drain regions from the first and second source/drain contacts and laterally separating the first and second source/drain contacts from the dielectric layer.

19. The transistor device of claim 16, further comprising:
a gate electrode laterally arranged between the first source/drain region and the second source/drain region;
a gate dielectric layer vertically separating the gate structure from the first silicon-doped InGaAs layer and laterally separating the gate structure from the first source/drain region and the second source/drain region; and
a spacer laterally arranged between the gate dielectric layer and the second silicon-doped InGaAs layer, wherein the spacer has an upper surface aligned with an upper surface of the second silicon-doped InGaAs layer.

* * * * *